United States Patent [19]

Mizuhara

[11] 4,435,480
[45] Mar. 6, 1984

[54] PRESSED AND SINTERED COMPOSITE BODY COMPRISING A THIN TAPE CAST LAYER AND A THICK BASE LAYER

[75] Inventor: Howard Mizuhara, Hillsborough, Calif.

[73] Assignee: GTE Products Corporation, Stamford, Conn.

[21] Appl. No.: 367,654

[22] Filed: Apr. 12, 1982

[51] Int. Cl.³ ............ B22F 7/02; B32B 15/16; B32B 9/00; B32B 9/04
[52] U.S. Cl. ............ 428/548; 428/546; 428/565; 428/332; 428/698; 428/699; 428/702; 428/926; 428/932; 419/6
[58] Field of Search ............ 428/546, 548, 565, 332, 428/698, 699, 702, 926, 932; 419/3, 6, 7, 40

[56] References Cited

U.S. PATENT DOCUMENTS

| | | | |
|---|---|---|---|
| 3,310,870 | 3/1967 | Parikh et al. | 419/40 X |
| 3,330,654 | 7/1967 | Sweet | 419/40 X |
| 3,577,226 | 5/1971 | Elbert et al. | 419/40 X |
| 3,786,854 | 1/1974 | Mizuhara et al. | |
| 3,916,506 | 11/1975 | Wolf | 428/698 X |
| 4,112,180 | 9/1978 | Steigelman | 419/15 X |
| 4,198,233 | 4/1980 | Frehn | 428/565 X |
| 4,359,335 | 11/1982 | Garner | 428/698 X |

Primary Examiner—Brooks H. Hunt
Assistant Examiner—Matthew A. Thexton
Attorney, Agent, or Firm—Donald R. Castle; John F. Lawler

[57] ABSTRACT

A composite body has a pressed mix base or layer and a thin facing layer formed by casting and bonded to the base and having desired physical properties different from those of the base. This body has utility as a semiconductor substrate with the cast layer providing a substantially defect-free surface for microcircuit formation, or as a cutting tool or the like with the cast layer constituting the hard wear-resistant cutting surface.

6 Claims, 8 Drawing Figures

PRESSED AND SINTERED COMPOSITE BODY COMPRISING A THIN TAPE CAST LAYER AND A THICK BASE LAYER

BACKGROUND OF THE INVENTION

This invention relates to composite bodies and more particularly to a composite body having a base comprising a dry pressed powder.

Dry pressed and sintered bodies made of alumina, for example, are used in the semiconductor industry as substrates for integrated circuits and the like in which conductive pastes and films are formed in the fine lines that are 0.002" wide or less. After deposition of the conductive lines, the substrate is airfired at about 950° C. causing the residue to adhere to the substrate surface. The substrate generally is made by compressing into a compacted body a spray-dried powder consisting, in this example, of alumina, flux, water and a binder, the powder being composed generally of spherically-shaped particles. Because of the shape of the particles, however, gap or voids exist between them and constitute minute defects in the substrate surface. The glassy phase produced by subsequent firing of the body often does not fill these voids which remain as surface defects. When the molecularly thin lines one to two mils wide are formed on the substrate, these surface defects can cause breaks or discontinuities in the lines and result in inoperative circuits.

Preparation of a substrate by casing, that is, doctor-blading a ceramic paste to form a tape, results in a body having a surface sufficiently defect-free to meet the requirements of microcircuit technology described above. An example of such a tape casting method is described in U.S. Pat. No. 3,786,854. While cast tape has a sufficiently smooth surface to accommodate fine line and high resolution circuitry, the formation of individual semiconductor substrates from such tape as by punching is much more difficult than with pressed powder resulting in punch pin breakage or deformation. In addition, the time required to dry green cast bodies at typical substrate thicknesses, say 70 mils, is uneconomically long.

Other techniques that may be employed in forming a substrate body having a substantially defect-free surface are building a laminated structure of layers cut from a thinner cast tape, and rolling a green mix to the desired substrate thickness. The disadvantages of the laminated body are the difficulty and time required in aligning and bonding the layers together. Rolled green substrates undergo dimensional shrinkage on drying and are difficult to form by punching as mentioned above.

The foregoing problem of producing substrates for the semiconductor industry is related to a problem encountered in the manufacture of high speed tools. Dry pressing and sintering of hard wear-resistant materials such as titanium nitride and titanium carbide to form cutting tools is not cost effective because of the relatively small cutting surface which uses these expensive materials. Current practice is to apply a thin layer of such materials to a less expensive tool body by the chemical vapor deposition technique. The disadvantage of this technique is that it requires use of dangerous chemicals and special gas scrubber apparatus for, toxic and corrosive exhaust gases.

This invention is directed to a composite body which overcomes the above disadvantages of semiconductor substrates and high speed tools.

OBJECTS AND SUMMARY OF THE INVENTION

A general object of the invention is the provision of a composite body having a substantially defect-free surface and which is economical to produce.

Another object is the provision of a high speed cutting tool which utilizes expensive hard facing materials in a cost effective manner.

These and other objects are achieved with a composite body having a first layer cut from a thin cast tape bonded to a thicker second layer of a dry pressed mix.

DESCRIPTION OF PREFERRED EMBODIMENTS

Figure 1:
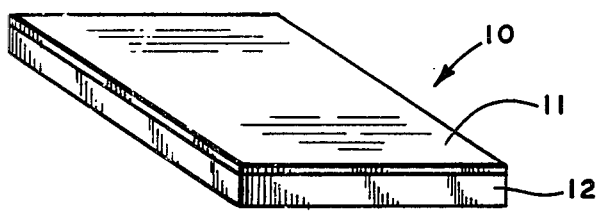
FIG. 1 is a perspective view of a composite body embodying this invention.
Figure 2:
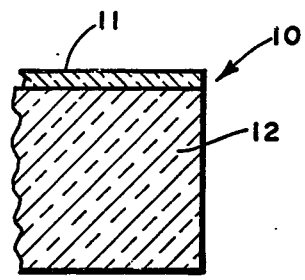
FIG. 2 is a transverse enlarged section of a portion of the composite body of FIG. 1.

Referring now to the drawings, FIGS. 1 and 2 illustrate a composite body 10 having a first layer 11 and a second layer 12 bonded together. Layer 11 is relatively thin compared to the thickness of layer 12 and is formed from a cast tape. The term "cast" as used herein means formation by means of depositing a paste or slurry of a selected material to a uniform thickness and drying to a flexible green state capable of supporting its own weight and of being wound on a reel for storage. Layer 12 comprises a compressed powder and both layers 11 and 12 are pressure-bonded together and sintered to form the composite body. By way of example, for a typical alumina semiconductor substrate, the final thickness of layer 11 may be in the range of 1 to 25 mils, preferably 20 mils; and the thickness of layer 12 about 60 mils.

The compositions of layers 11 and 12 may be the same or different depending upon the intended use of the composite body. For example, when body 10 is to be used as a semiconductor substrate, layers 11 and 12 may consist of alumina, the upper surface 11a of layer 11 being substantially defect-free as a consequence of being formed by casting. In other applications, layers 11 and 12 may have different compositions as, for example, when body 10 is a cutting tool and layer 11 is composed of a hard facing material such as titanium carbide and layer 12 comprises steel. In each of the above applications, the density of the first layer 11 is high and its surface 11a is smooth and substantially defect-free. This characteristic has utility and advantage when the body is used as a semiconductor substrate for continuous fine line circuit deposition and as a cutting tool for economical use of expensive hard facing materials on inexpensive supporting components, and for optimum grinding or honing to provide a sharp cutting edge.

Figure 3:
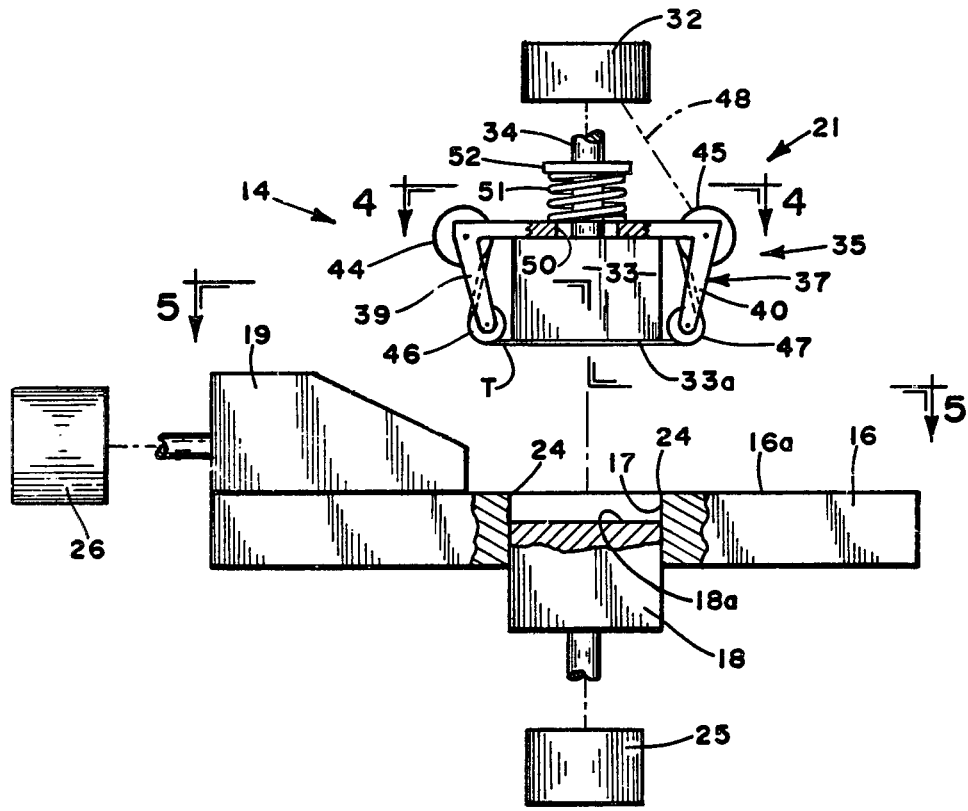
FIG. 3 is a schematic elevation of apparatus for making the composite body of this invention.
Figure 4:
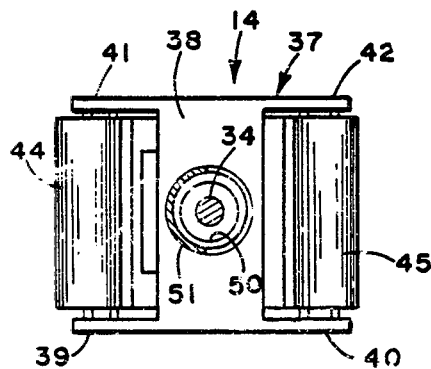
FIGS. 4 and 5 are plan views partially in section of the apparatus taken on lines 4—4 and 5—5, respectively, of FIG. 3.
Figure 5:
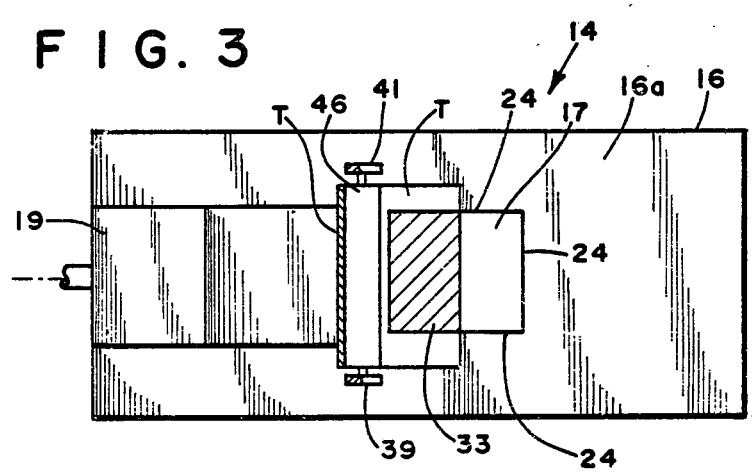

Apparatus for making the composite body 10 is shown at 14 in FIGS. 3, 4 and 5 comprises a die plate 16 having a recess 17 in the plane upper surface 16a thereof, a base block 18 movable vertically as shown in recess 17 and forming the bottom wall thereof, a feed block 19 supported by and movable on plate 16, and a die block assembly 21 spaced above plate 16 in alignment with recess 17 and movable toward and away from plate 16.

Plate surface 16a is flat and forms cutting edges with 24 with the sides of recess 17 which is rectangular, as shown, or any other shape desired for the composite body. Block 18, which has the same shape and substantially the same or slightly smaller transverse dimension as recess 17, is connected to a motor 25 for close vertical sliding movement within recess 17 and is spaced a predetermined distance from plate surface 16a at the lower end of block movement as shown in FIG. 3 so that the top of the block is the bottom wall of the recess. Block 18 is flush with plate surface 16a at the upper end of its movement, see FIG. 8.

Figure 6:
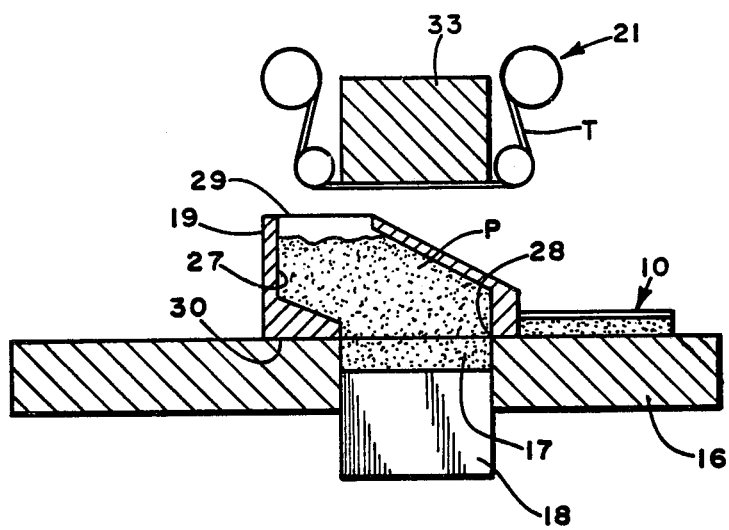
FIGS. 6, 7 and 8 are schematic elevations of the apparatus of this invention showing the positions of the parts at different stages in the formation of the composite body.

Feed block 19 is movable by motor 26 between a position offset from recess 17 as shown in FIG. 3 to a position over recess 17, see FIG. 6. Block 19 has a chamber 27 for storing in loose powder form the material P constituting the second layer 12 of composite body 10 and has an opening 28 adjacent to plate 16 with dimensions substantially the same as those of recess 17. Another opening 29 in the top of block 19 permits chamber 27 to be refilled with powder from time to time. The lower surface 30 of block 19 rides closely on die plate surface 16a so that feed opening 28 of block 19 is opened and closed when the latter is respectively aligned with and offset from recess 17. Feed block chamber 27 is periodically refilled with powder P from a supply source, not shown, when the feed block is offset from recess 17.

Die block assembly 21 is supported for movement in a vertical direction by a motor 32 and comprises a die block 33 connected by shaft 34 to motor 32 and a tape assembly 35. Block 33 has substantially the same shape and transverse dimensions as block 18 and has a flat lower face 33a. Assembly 35 comprises a frame 37 supported on the top of die block 33 by a transverse member 38 see FIG. 4, having longitudinally spaced depending arms 39, 40 and 41, 40 on opposite sides, respectively, of block 33. A supply reel 44 of thin flexible cast tape T comprising the first layer 11 of composite body 10 is rotatably mounted between the upper parts of arms 39 and 41 and a similar take-up reel 45 is rotatably mounted between the upper parts of arms 40 and 42. Idler rolls 46 and 47 are similarly mounted between the lower ends of the arms and function to guide tape T from supply reel 44 to take-up reel 45 across lower face 33a of block 33. Take-up reel 45 is periodically rotated by motor 32 as indicated by the broken line 48 to advance tape T across the die block face as explained below. Tape T is substantially wider than recess 17.

Tranverse member 38 of frame 37 has an opening 50 through which shaft 34 extends for connection to die block 33. Compression spring 51 mounted between a abutment 52 fixed on shaft 34 and transverse member 38 resiliantly biases the latter against the top of die block 33 and permits relative movement between the latter and frame 37 to punch layer 11 from tape T.

Figure 7:
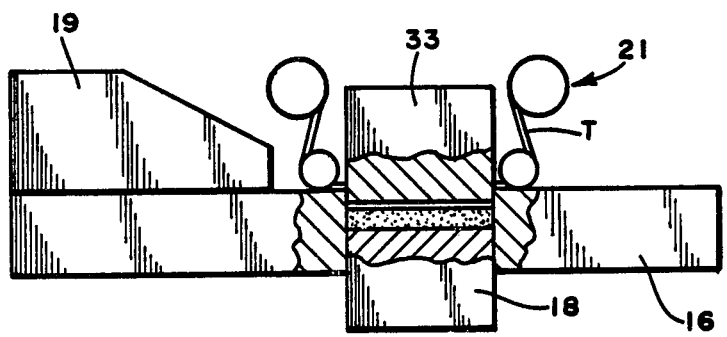

The method of making the composite two layer body 10 is now described with reference to FIGS. 3, 6, 7 and 8. At the start of the cycle, die block assembly 21 is in the upper position shown in FIG. 3 spaced above die plate 16, base block 18 is spaced below the plate surface 16a to form recess 17, and feed block 19 is offset from recess 17. Motor 26 is energized to move feed block 19 over recess 17, see FIG. 6, so that a charge of powder P passes from chamber 27 into recess 17. Block 19 is then withdrawn to its initial position offset from recess 17 as shown in FIG. 7. Thereafter die block assembly 21 is moved downwardly by motor 32 until tape T overlays recess 17 and frame 37 (or parts attached to it) abut plate 16. Motor 32 continues to move block 33 downwardly into recess 17 through tape T, cutting layer 11 from the tape and simultaneously compressing it against and compacting powder P as shown in FIG. 7. When block 33 moves downwardly into the recess 17, spring 51 is compressed against frame 37 to accomodate the required relative movement between block 33 and tape T.

Figure 8:
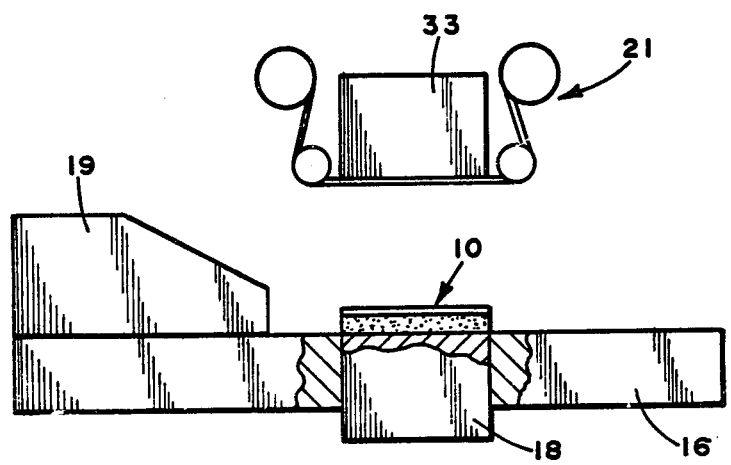

Die block assembly 21 is next retracted to its initial upper position while motor 32 causes take-up reel 45 to advance the tape across the face 33a of block 33 for the next cycle. While assembly 21 is being retracted, base block 18 is moved upwardly by motor 25 to eject the compressed composite body 10 from the recess as shown in FIG. 8. Thereafter motor 26 advances feed block 19 to the position shown in FIG. 6 to move body 10 from the base block 18 to plate 16 and, when block 18 is withdrawn to its lower position, to fill the reformed recess with powder P and the cycle is again repeated.

Composite body 10 is sintered at a temperature appropriate for the materials selected and is ready for its intended use.

The method described above may be modified using the same apparatus to provide a composite substrate having thin cast layers 11 on opposite sides of a compacted power layer 12 in event such a three layer composite body is desired. Such a body is made with the apparatus described above by punching a layer 11 from tape T as described above but with recess 17 empty, that is, without a charge of powder in the recess. This places one layer 11 at the bottom of recess 17 on upper face 18a of block 18. Thereafter assembly 21 is retracted, take-up reel 45 is driven by motor 32 to advance the taper under die block 33, feed block 19 is moved over recess 17 and fills it with powder, and, after withdrawal of block 19, assembly 21 is again lowered against plate 16 to punch the top layer 11 from the tape and to simultaneously compress it and the lower layer and the powder into a three-layer composite body. After retraction of assembly 21 base block 18 is moved upwardly to eject the three layer composite body, feed block 19 moves across plate 16 to displace the body from block 18, and after feed block 19 is withdrawn, base block 18 is moved to its lower position and the process is repeated. The composite body is sintered at a temperature compatible with the materials of the three layers to form a tightly bonded composite structure.

The above described apparatus and method are used to make composite bodies with other materials and for other purposes. The technique may be used with utility and advantage, for example, for hard facing various cutting tools requiring expensive materials such as titanium nitride, titanium carbide and tantalum nitride which, in the past, normally has been mixed uniformly into the bulk mix and pressed and sintered or applied to a body by chemical vapor deposition.

A silicon nitride cutting tool is made in accordance with this invention by bonding a cast layer of titanium nitride and silicon nitride on a silicon nitride powder substrate by copressing and sintering as described above. The silicon nitride mix which is cast into a flexible tape consists of (all percent by weight);

Mix A

30% TiN
9.1% $Y_2O_3$
2.1% $Al_2O_3$
58.8% $Si_3N_4$

The finely ground system of Mix A is mixed with a solution of Mix B having a composition of Mix B 6% Polyvinyl Butyral
6% Dibutyl Phthalate
44% Methanol
44% Toluene to the following composition:
80% Mix A
20% Mix B.

This batch is blended and cast with a 0.010" knife opening and on drying produces a green tape having a thickness of about 5 mils A dry pressing silicon nitride mix is made with a composition of Mix C 13% $Y_2O_3$
2% $Al_2O_3$
85% $Si_3N_4$ and a 5% 20,000 CPS polyethylene glycol binder.

The die plate recess is filled with Mix C and the green tape placed on top of the powder and copressed at about 20,000 to 30,000 psi pressure and thereafter ejected. The composite body is sintered at 1770° C. by a 2 hour soak in a nitrogen atmosphere.

A coated tungsten carbide cutting tool is made by preparing a mixture of granulated tantalum carbide, tungsten carbide and cobalt, mixing it with a binder of Mix B and casting it into a tape having a thickness of approximately 10 mils in the green state. This tape is placed over recess 17 filled with a powder mixture consisting of (in percent by weight) 6% cobalt and 94% tungsten carbide with 1% paraffine binder and both the tape and powder mixture are copressed at 30,000 to 40,000 psi. Thereafter the composite body is ejected, heated to a temperature of 250° C. to remove the binder and thereafter is sintered at 1500° C. in a hydrogen atmosphere. The resulting composite body is the functional equivalent of a tool having tantalum nitride disbursed uniformly throughout the tool body.

High speed cutting tools using titanium carbide in a steel matrix is widely used in industry. To make such a tool in accordance with this invention, a thin flexible green tape approximately 5 to 10 mils in thickness is cast from a mixture of granulated titanium carbide, steel, and Mix B described above. The green tape is placed over recess 17 containing a powder mixture of the steel alloy and both tape and powder are copressed at approximately 50,000 psi. The composite body is ejected, heated to approximately 250° C. to remove the binder, and thereafter is sintered at approximately 1200° C. The resulting composite body provides a high speed cutting tool which is the equivalent of one having the expensive titanium carbide compound dispersed throughout the entire system.

Another composite body made with utility and advantage in accordance with the invention is a silver contact made with a cadmium oxide additive for the purpose of suppressing arcing and preventing the fusing together of silver contact points. A mix containing a high cadmium oxide content and silver cannot easily be rolled down because of its brittle characteristic and further a brazing alloy does not wet a system with a high cadmium oxide content. Such a contact is made in accordance with this invention by preparing a flexible green tape made from a mixture of silver powder, cadmium oxide powder and Mix B (binder), cast to a thickness of approximately 60 mils. Granulated silver powder is deposited in cavity 17 and is copressed as described above with a layer cut from the above tape to a pressure of 30,000 psi, heated to 250° C. in air to remove the binder, and thereafter sintered at 750° C. in a nitrogen atmosphere. This composite body provides an excellent contact with arc suppression and anti-fusing characteristics. Alternatively, to conserve the expensive silver component, silver-plated copper may be substituted for the pure silver powder to provide a functionally equivalent contact at lower cost.

An alumina substrate embodying this invention and useful in fabrication of microcircuits was made in accordance with the above described technique with a ceramic spray dried mix consisting of, in percent by weight, 99.6 alumina and 0.4 talc; a tape vehicle consisting of 6.0 polyvinylbutyral, 6.0 dibutyl phthalate, 44.0 methanol and 44.0 toluene and a spray drying binder system consisting of (in percent dry weight) 2.0 polyvinyl alcohol and 2.0 polyethylene glycol.

The mix was prepared by placing in a 1.3 gallon mill 1440 grams of slurry consisting of 1000 grams of the above mix, 400 grams water, 20 grams polyvinyl alcohol and 20 grams polyethylene glycol. The mix was milled for 16 hours and spray dried.

Dried tape with a thickness of 0.003" was prepared by milling 2000 grams of a composition consisting of 80% of the above mix and 20% of the tape vehicle for 25 hours in a 1.3 gallon mill, and casting on a 2 mil Mylar sheet using a 0.005" doctor blade opening. The tape approximately 0.003" was peeled off when dried.

Recess 17 was filled with the spray-dried mix in powder form and the tape placed on top of the recess. Die block 33 was moved down through the tape into the recess cutting the tape and copressing it and the powder. The composite body was ejected and thereafter sintered. The tape surface was extremely smooth and substantially defect-free.

I claim:
1. A composite body comprising
   a first layer of an alumina ceramic made by tape casting, and
   a second layer of
   an alumina ceramic having a composition substantially identical to said first layer, second layer being formed from a compressed powdered alumina,
   the thickness of said first layer being uniform and substantially less than the thickness of said second layer,
   said first and second layers being permanently bonded together by simultaneously compressing said first layer against and compacting the powder comprising said second layer to form a compressed composite body and sintering.
2. The body according to claim 1, said first layer having a thickness of 0.001 to 0.025 inches.

3. A composite body comprising
a first layer composed of a first substance made by tape casting, and
a second layer composed of a second substance, said second substance being a compressed powder,
the thickness of said first layer being uniform and substantially less than the thickness of said second layer,
said first and second layers being permanently bonded together by simultaneously compressing said first layer against and compacting the powder comprising said second layer to form a compressed composite body and sintering, wherein said first and second layers are different compositions.

4. The body according to claim 3 in which said first substance comprises a mixture of silver and cadmium oxide, said second substance comprising silver.

5. The body according to claim 3 in which said first substance comprises a mixture of silicon nitride and titanium carbide, said second substance comprising silicon nitride.

6. The body according to claim 3 in which said first substance comprises a mixture of steel and titanium nitride, said second substance comprising steel.

* * * * *